United States Patent [19]

del Rio

[11] 4,284,033
[45] Aug. 18, 1981

[54] MEANS TO ORBIT AND ROTATE TARGET WAFERS SUPPORTED ON PLANET MEMBER

[75] Inventor: Eddy H. del Rio, Jupiter, Fla.

[73] Assignee: RCA Corporation, New York, N.Y.

[21] Appl. No.: 89,858

[22] Filed: Oct. 31, 1979

[51] Int. Cl.³ ............................................. C23C 13/08
[52] U.S. Cl. ........................................ 118/730; 269/57
[58] Field of Search ............................ 118/729–731, 118/500–503; 269/57; 427/91, 99, 255.5

[56] References Cited

U.S. PATENT DOCUMENTS

| | | | |
|---|---|---|---|
| 3,598,083 | 8/1971 | Dort | 118/730 |
| 3,643,625 | 2/1972 | Mahl | 118/730 X |
| 3,783,821 | 1/1974 | Dobson et al. | 118/730 |
| 3,853,091 | 12/1974 | Christensen et al. | 118/730 X |
| 3,926,421 | 12/1975 | Reiger et al. | 269/57 |
| 3,983,838 | 10/1976 | Christensen | 118/730 |
| 4,087,239 | 5/1978 | Cline et al. | 269/57 X |

Primary Examiner—Morris Kaplan
Attorney, Agent, or Firm—Birgit E. Morris; D. S. Cohen; Lawrence P. Benjamin

[57] ABSTRACT

A vapor deposition system wherein means orbit a plurality of rotating planets. Each planet supports a plurality of wafer targets which orbit the associated planet axis. A planet wheel of limited rotatability is operative to effect rotation of the orbiting wafer targets.

4 Claims, 3 Drawing Figures

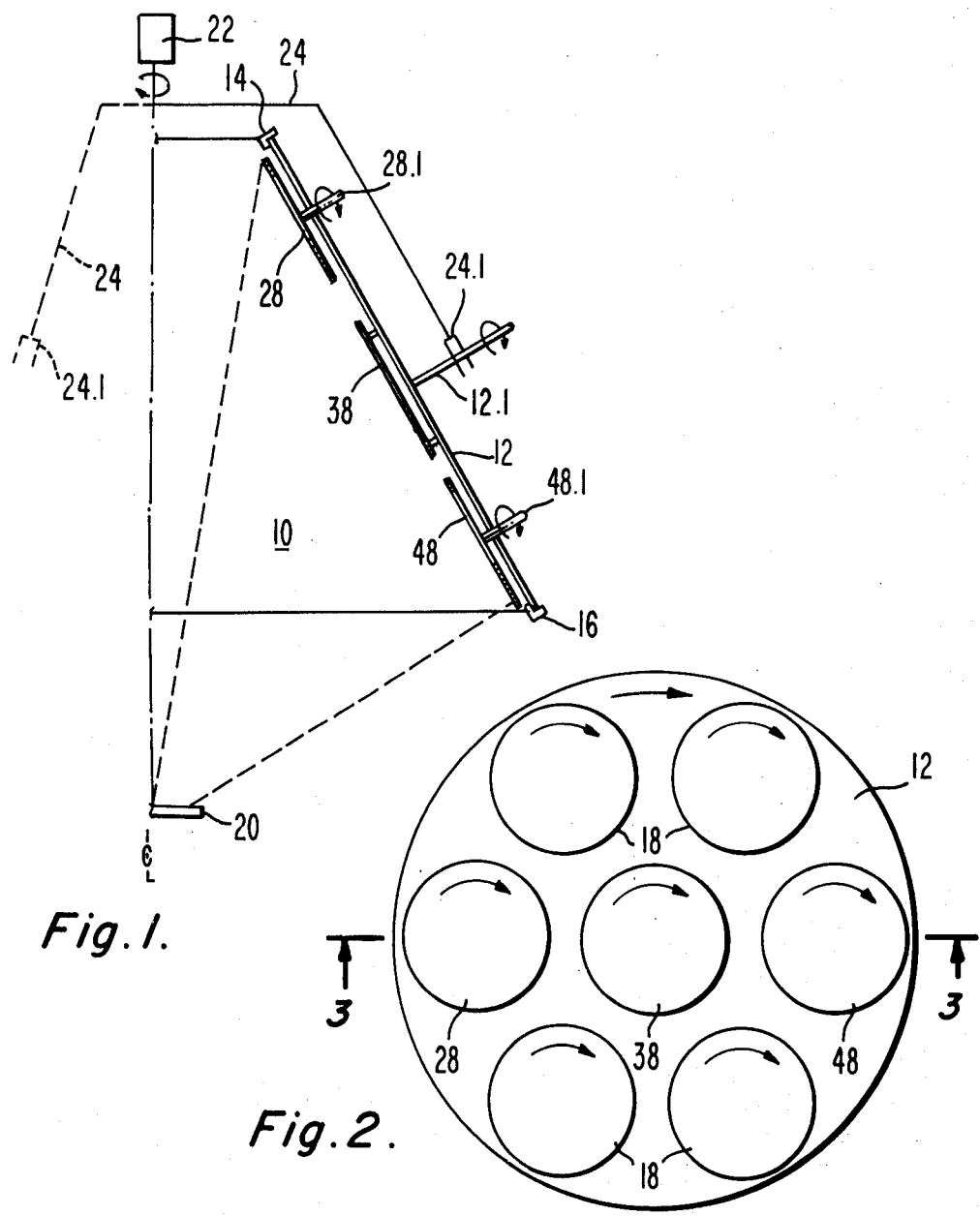
Fig. 1.
Fig. 2.
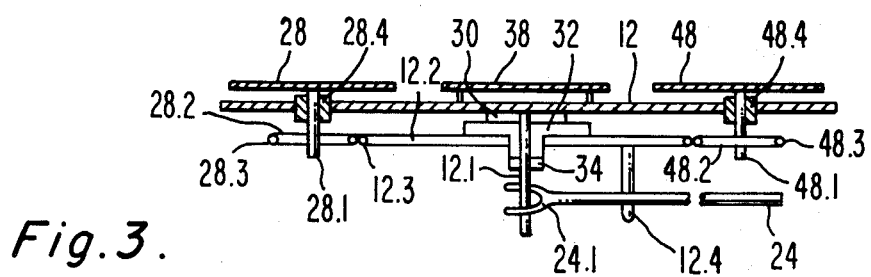
Fig. 3.

MEANS TO ORBIT AND ROTATE TARGET WAFERS SUPPORTED ON PLANET MEMBER

BACKGROUND OF THE INVENTION

This invention relates, in general, to deposition systems and more particularly to improvements in vacuum deposition systems that will insure a higher degree of uniformity of deposited material.

The typical production deposition system used for the deposition of either a layer of a single element or a layer of a combination of elements on a substrate consists of a vacuum chamber in which is contained the source of the material to be deposited and a substrate or target on which the source material is deposited. The system is usually placed on the vacuum and when the pressure within the vacuum chamber is reduced to the required level, the source material is heated to the point of vaporization and deposition on the target occurs.

In an attempt to insure a uniform deposition of source material in a production system which, for example, is required to deposit a layer of aluminum on a semiconductor wafer, as many as seven or eight wafer targets each having a three inch diameter are usually mounted on a disc or planet. A plurality of planets (usually three) are then mounted in rolling engagement on a pair of circular tracks so as to position the planets in a plane inclined toward the source. The source is usually located on the system axis and traditionally is positioned a few inches below the plane of the lower track on which the planets are rotating. The planets are then caused to rotate about the source, on the tracks, while the source material is vaporized. Thus, as each planet rotates about its axis each wafer target to be coated is caused to rotate about the axis of the planet and about the axis of the system.

In theory each of the wafer targets should be uniformly coated in order to achieve the best processing results. However, in actual practice, only the wafer target located on the axis of the planet will be uniformly coated while the wafers arranged around the planet, at its perimeter, will not achieve a uniform coating. This is based on the theory that since the density of evaporated material is inversely proportional to the square of the distance between the source and the wafer target, that portion of the wafer target closest to the perimeter of the planet will be exposed to a significantly higher density of material than its diametrically opposed portion. This phenomenon becomes more apparent when one considers the relative densities of evaporated material when the target is, for example, in the lowest portion of its travel, that is, when it's closest to the source as compared to the density of evaporated material when the wafer target is at the highest point of its travel, that is, when it is furthest from the source. The differences in density of material is reversed as the wafer target is rotated from its lowest point to its highest point about the axis of the planet. However, these differences in diffusion densities do not counteract each other and the net result is that the portion of the wafer target that is closest to the source when the wafer target is at the bottom of its travel will have a higher concentration of deposited material than the remainder of the wafer target. I have found, for example, a variation in coating thickness of as much as 3,000 Angstroms in a 12,000 Angstrom thick layer. Such variations in thickness across a wafer target having integrated circuits formed thereon can cause severe problems during the subsequent etching step.

SUMMARY OF THE INVENTION

In accordance with the teachings of my invention a vacuum deposition system is described wherein the deposited material is more uniformly distributed across the wafer target than heretofore possible. This is accomplished by causing a wafer target to rotate about its own axis at about three times the speed at which the planet on which it is mounted rotates about its own axis and about the system axis.

BRIEF DESCRIPTION OF THE DRAWINGS

FIG. 1 is a schematic representation of a vacuum deposition system, partially in cross section, showing the relative placement of the planet and the wafer target with respect to the source.

FIG. 2 is a plan view of the planet; and

FIG. 3 is a section taken along lines 3—3 of FIG. 2 showing the planet, the mounting of the wafer targets and one means for driving the wafer targets and rotating the planet.

DETAILED DESCRIPTION OF THE INVENTION

Referring now to FIG. 1, there is shown a partial schematic of the invention, it being understood that the entire mechanism will be included in an air-tight vacuum chamber (not shown). As shown, planet 12 rests in circular tracks 14 and 16 in rolling engagement therewith and is tilted toward the source 20 at about a 60 degree angle from the horizontal. Planet 12 is provided with a shaft 12.1 which is in engagement with fork 24.1 which is connected to motor 22 by means of drive arm 24. Drive arm 24 may be one of a plurality of arms and forks 24 and 24.1 as shown dotted. These forks and arms 24.1 and 24, respectively, usually number about 3 and are spaced approximately 120° apart with each individual arm and corresponding fork driving corresponding planets 12 (not shown). Thus, as motor 22 rotates, as shown by arrows, the planets are caused to move about the axis of the system and rotate or roll along circular tracks 14 and 16. This circular and rotational movement is indicated by the arrow about arm 12.1. Wafer targets 28 and 48 are shown having rotatable shafts 28.1 and 48.1, respectively, extending therefrom. The operation of the wafer targets 28 and 48 and their cooperation with planet 12 will be explained in more detail in the discussion of the subsequent Figures.

Referring now to FIGS. 2 and 3, there is shown, in plan view, a rotatable planet of the subject invention with the rotatable wafer targets 18, 28 and 48. In this Figure, it should be understood that wafer target 38 is not independently rotatable as are the remainder of the wafer targets 18, 28 and 48. Instead, wafer target 38 is fixed to planet 12 at about the axis of planet 12 and, as such, will rotate at the same speed as planet 12. Further, although not shown in FIG. 3, wafer targets 18 are identical in structure and operation to wafer targets 28 and 48. Accordingly, the following description of the operation of wafer targets 28 and 48 applies as well to wafer targets 18.

FIG. 3 is a cross section of the planet structure of FIG. 2 taken along lines 3—3 and shows, for example, wafer target 28 fixed at one end of shaft 28.1 rotatably mounted in bearing member 28.4. Similarly, wafer target 48 is shown at one end of shaft 48.1 and rotatably mounted in bearing member 48.4. Both bearing members 28.4 and 48.4 are affixed to planet member 12. Near the other end of shaft 28.1 there is affixed thereto wheel member 28.2 having friction member 28.3 arranged around the perimeter thereof. Similarly, at the far end of shaft 48.1 there is provided wheel member 48.2 having friction member 48.3 affixed around the perimeter thereof. Planet 12 is also provided with shaft 12.1 at its center of rotation. Adjacent planet 12 there is shown spacer 30 and flange 32 to which is affixed the planet drive wheel 12.2. Collar 34 is provided in order to maintain drive wheel 12.2 in a fixed, longitudinal position on shaft 12.1 and is keyed or fixed to shaft member 12.1 either by a roll pin or by a set screw (not shown). Planet drive wheel 12.2 is affixed to flange 32 which is, in turn, free to rotate about shaft 12.1. However, in order to limit the motion thereof, planet drive wheel 12.2 is provided with stop member 12.4 which engages driving arm 24. Thus, as planet 12 is caused to move about, in tracks 14 and 16 (FIG. 1) in a rolling motion, drive wheel 12.2 will rotate until such time as stop member 12.4 engages drive arm 24. Friction member 12.3 is arranged around the perimeter of drive wheel 12.2 and is in engagement with friction member 28.3 and 48.3 of wafer target 28 and 48, respectively. Thus, as fork member 24.1 engages shaft 12.1 of planet 12, causing the planet to roll about the axis of the system, stop member 12.4 upon becoming engaged with drive arm 24 will cause drive wheels 28.2 and 48.2 to rotate planets 28 and 48, respectively. By appropriately choosing the ratio of the diameter of drive wheel 12.2 to the diameter of drive wheels 28.2 and 48.2, it will thus be obvious that target wafers 28 and 48, respectively, can be driven at any speed. I have found that a wafer target having a speed of about three times the rotation of planet 12 will produce satisfactory results.

While in the foregoing exegesis I have described and shown my invention in terms of a planet and drive wheel which is in frictional engagement with corresponding drive wheels of the wafer targets, it should now be obvious to those skilled in the art that there are other suitable means for driving the wafer targets to accomplish the same result. For example, it could be done magnetically or by means of a direct gear drive between the planet and the rotating wafer targets. Similarly, while I have chosen to show a planet driven by a rotating arm, it will now become obvious that my invention is applicable to other planet systems wherein the drive means might, for example, be in the form of a geared arrangement.

The improved vacuum deposition system, when constructed in accordance with the teachings herein, will thus provide the user with a vacuum deposition system wherein uniform coatings may be deposited on, for example, semiconductor wafers. By rotating the individual wafer targets about their own axes, while rotating about the system axis, the wafer targets will not exhibit the defects produced in the prior art deposition systems but instead will allow a uniform coating to be deposited over each of the wafer targets irrespective of the position of the wafer on the rotating planet.

What is claimed is:

1. In a vacuum deposition system including a source of material positioned on the axis of the system, a plurality of circular planet members mounted for orbital movement about the system axis and for rotational movement about its own axis, a plurality of wafer targets for supporting an equal plurality of substrates on which the source material is to be deposited, a plurality of the wafer targets mounted on each of the planet members within the perimeter thereof, the improvement comprising for each planet and its associated wafer targets:

a planet shaft member one end of which is mounted on the rotational axis of the planet;

a planet wheel member mounted on, and having limited rotation with, the planet shaft member;

each wafer target having a shaft member with an end thereof extending from the rotational axis of the target;

a wafer target drive wheel fixed on the wafer target shaft member;

the perimeters of the planet and wafer target drive wheels being operatively associated with one another;

a drive arm orbiting the axis of the system and operatively associated with the planet shaft whereby to carry said planet through said orbital and rotational movement; and a stop element extending generally parallel to the planet shaft member and outwardly from the planet drive member;

said stop element being operatively associated with the drive arm whereby during said rotational movement of the planet, the stop element contacts the orbiting drive arm to thereby stop further rotational movement of the planet wheel to thereby initiate rotational movement of the orbiting wafer target drive wheel due to said operative association of the perimeters.

2. The vacuum deposition system of claim 1, wherein: the wafer target is rotated about three times faster than the planet.

3. The vacuum deposition system of claim 2, wherein: the perimeter of the planet drive wheel and the perimeter of the wafer target drive wheel are in frictional engagement with each other to produce said rotational movement in the wafer target when the planet rolls about the axis of the system.

4. The vacuum deposition system of claim 2, wherein: the perimeter of the planet drive wheel is provided with gear teeth which gear teeth mesh with corresponding gear teeth in the perimeter of the wafer target drive wheel to produce said rotational movement of the wafer target when the planet rolls about the axis of the system.

* * * * *